US010995986B2

(12) United States Patent
Kunitomo et al.

(10) Patent No.: US 10,995,986 B2
(45) Date of Patent: May 4, 2021

(54) DRYER

(71) Applicant: SUGINO MACHINE LIMITED, Uozu (JP)

(72) Inventors: Daisuke Kunitomo, Uozu (JP); Yoshiteru Kawamori, Uozu (JP); Toyoaki Mitsue, Uozu (JP)

(73) Assignee: SUGINO MACHINE LIMITED, Uozu (JP)

( * ) Notice: Subject to any disclaimer, the term of this patent is extended or adjusted under 35 U.S.C. 154(b) by 192 days.

(21) Appl. No.: 16/266,373

(22) Filed: Feb. 4, 2019

(65) Prior Publication Data

US 2019/0390904 A1 Dec. 26, 2019

(30) Foreign Application Priority Data

Jun. 22, 2018 (JP) ............................ JP2018-118750

(51) Int. Cl.
*F26B 7/00* (2006.01)
*F26B 3/02* (2006.01)
(Continued)

(52) U.S. Cl.
CPC .................. *F26B 7/00* (2013.01); *F26B 3/02* (2013.01); *F26B 5/08* (2013.01)

(58) Field of Classification Search
CPC ...... F26B 1/00; F26B 3/02; F26B 5/08; F26B 7/00
See application file for complete search history.

(56) References Cited

U.S. PATENT DOCUMENTS 763,487 A * 6/1904 Hinton ...................... F26B 5/08 34/58
2,425,546 A * 8/1947 Lindsey .................... F26B 5/08 34/58
(Continued)

FOREIGN PATENT DOCUMENTS

CN 102235561 A 11/2011
CN 103629911 A 3/2014
(Continued)

OTHER PUBLICATIONS

Office Action dated Jun. 2, 2020 in a corresponding Chinese patent application No. 201910120669.7.
(Continued)

*Primary Examiner* — Jorge A Pereiro
*Assistant Examiner* — Logan P Jones
(74) *Attorney, Agent, or Firm* — United IP Counselors, LLC

(57) ABSTRACT

A dryer for increasing the dryness by fixing the inside of a bowl-shaped workpiece toward a rotating table side is provided.

A dryer for drying an object includes a rotatable hollow cylindrical rotation shaft, a center shaft supported inside of the rotation shaft via a bearing and does not rotate, the center shaft having an inner blow passage therein extending along the center shaft, a rotation plate fixed to the first end of the rotation shaft; an inner fixed nozzle extending along the first end of the rotation shaft from the center shaft, a jig disposed on the rotation plate for fixing the object, a drive motor for rotating the rotation shaft, and a blower connected to the inner blow passage.

19 Claims, 5 Drawing Sheets

(51) Int. Cl.

| | |
|---|---|
| ***F26B 5/08*** | (2006.01) |
| ***F26B 1/00*** | (2006.01) |
| ***F26B 11/18*** | (2006.01) |
| ***F26B 21/00*** | (2006.01) |

(56) References Cited

U.S. PATENT DOCUMENTS 2,856,700 A * 10/1958 Wales .................... A45D 20/08 34/91
3,953,626 A * 4/1976 Suzuki .................... B05C 11/06 427/346
4,471,537 A * 9/1984 Meda .................... D06F 58/206 34/77
4,651,440 A * 3/1987 Karl ........................ G03F 7/168 34/58
5,469,634 A 11/1995 Mezaki
6,276,378 B1 8/2001 Taniyama et al.
6,725,563 B1 * 4/2004 Miyamoto .......... F26B 11/0436 34/129
2001/0025429 A1 * 10/2001 Middelkoop ............. F26B 5/08 34/58
2006/0219264 A1 * 10/2006 Miya ................. H01L 21/67051 134/21
2009/0297705 A1 * 12/2009 Itoh ................... H01L 21/68742 427/240

FOREIGN PATENT DOCUMENTS

CN 108131922 A * 6/2018
JP 04-045586 U 4/1992
JP 2003-022997 A 1/2003
JP 2016-149470 A 8/2016

OTHER PUBLICATIONS

Extended European Search Report dated Mar. 27, 2019 in a corresponding European patent application No. 19155579.6 (8 pages).

* cited by examiner

DRYER

CROSS-REFERENCE TO RELATED APPLICATIONS

This application claims the benefit of priority to Japanese Patent Application No. 2018-118750, filed on Jun. 22, 2018, the entire contents of which are hereby incorporated by reference.

BACKGROUND

1. Technical Field

The present invention relates to a dryer.

2. Description of the Background

There has been proposed a centrifugal dehydrator in which a product is fixed on rotating tables, and hot air is blown onto the product as the rotating table rotates to dry the product (Japanese Unexamined Utility Model Application Publication No. 4-45586).

BRIEF SUMMARY

Provided is a dryer for increasing the degree of dryness by fixing an inner side of a bowl-shaped workpiece toward a rotating table side.

A dryer for drying an object of the present invention includes a hollow cylindrical rotation shaft configured to rotate;

a center shaft supported inside of the rotation shaft via a bearing, the center shaft configured not to rotate; the center shaft having an inner blow passage therein extending along the center shaft;

a rotation plate fixed to a first end of the rotation shaft;

an inner fixed nozzle extending along the first end side of the rotation shaft from the center shaft;

a jig disposed on the rotation plate for fixing the object;

a drive motor configured to rotate the rotation shaft; and a blower connected to the inner blow passage.

The dryer of the present invention is mainly used for the purpose of drying a drying object after washing (hereinafter simply referred to as "object"). The object is a mechanical component. Objects are primarily bowl-shaped objects such as automotive case transaxles, housing transaxles, oil pump covers. The dryer shakes off the cleaning liquid remaining on the surface of the object by centrifugal force. Further, the dryer blows the cleaning liquid from the object by the air jetted from the blow nozzle. The washing liquid is mainly an aqueous washing liquid, but typical washing liquid is applicable.

When the bowl-shaped object is mounted on the rotation plate of the cantilever shaft, if the object is turned down and the inside is directed toward the shaft side, the center of gravity of the rotation object approaches the cantilever shaft, and therefore, it is stabilized. However, when the bowl-shaped object is mounted on the rotation plate so as to face inward, the cleaning liquid on the inner surface side is hardly shaken off. The present invention provides a blow nozzle inside a rotation plate.

A center shaft passes through the inner side of the hollow cylindrical rotation shaft. The rotation axis may be provided in a vertical direction, a horizontal direction, or a direction inclined obliquely from the vertical. The center shaft is supported by the rotation shaft via a bearing. The rotation shaft is supported from the outside and the inside. The rotation plate is fixed to the first end on the first direction side of the rotation shaft. The inner fixed nozzle is fixed to the first end of the center shaft. The inner fixing nozzle protrudes from the rotation plate to the object side and is fixed. The object is fixed to the rotation plate by a jig. Rotation of the rotation shaft causes the object to rotate. The cleaning liquid remaining on the object is shaken off by the centrifugal force. In addition, the inner fixed nozzle blows dry air towards the object. The inner surface of the object is blown off by dry air. Blowing from the inside and centrifugal force promote drying of the object.

The inner fixed nozzle is preferably a slit nozzle. The slit opens in the radial direction. The slit extends in the axial direction of the rotation shaft. Curtain shaped dry air is ejected from the inner fixed nozzle. Therefore, uneven drying is reduced. Preferably, the slit extends around to the center of the distal end of the inner fixation nozzle. If the slit extends to the center of the distal end, the inner fixed nozzle can blow to the bottom of the object.

The inner fixing nozzle may include a fixed pipe and a plurality of nozzles arranged in the fixed pipe. In this case, preferably, the plurality of nozzles are arranged in the axial direction of the rotation shaft with almost no gap therebetween.

The jig is provided on the rotation plate. The jig includes clamps, seating pins and/or positioning pins. The clamp is preferably a clamp using a cylinder. The cylinder is preferably an air cylinder. In this case, the fluid for driving the cylinder is supplied through the rotation shaft. A fluid rotary joint is provided at the second end of the rotation shaft. The fluid rotary joint includes a housing, an annular passage, a first passage, and a second passage. The first passage connects the annular passage and the fluid pressure generating source. The second passage is provided inside the rotation shaft. The second passage connects the annular passage and the cylinder.

Preferably, the dryer has an outer blow pipe. The outer blow pipe is located on an installation plane which is a plane containing the axis of rotation of the object. The outer blow nozzles are arranged such that rotation of the object, jig and rotation plate does not interfere. The outer blow pipe is disposed along the surface of the object. The outer blow pipe is fixed to a frame or the like. The outer blow pipe may extend radially inward. At this time, the outer blow pipe extends from the outer side in the radial direction to the inner side. The outer blow pipe may extend to the center of rotation. The outer blow nozzle blows the outer surface of the object. Preferably, the outer blow nozzle blows the entire outer surface of the object. Preferably, the outer blow nozzle is arranged on an installation plane which is a plane containing the axis of rotation of the object. The outer blow nozzle may be provided on the outer blow pipe. The outer blow nozzles are arranged outside the outer surface of the cross-section according to the installation plane of the rotation object, jig and rotation plate. The outer blow nozzles eject dry air.

Preferably, the rotation plate has an opening for exposing the object when viewed from the second direction side. That is, when viewed from the surface of the rotation plate opposite to the surface to which the object is fixed, a part of the object is exposed from the rotation plate. Typically, the rotation plate is a star shape in which several thin rod-shaped flat plates radiate from the rotation shaft. A clamp, a seating pin, and/or a positioning pin are provided at a distal end portion of the flat plate extending from the rotation shaft.

Preferably, the dryer has a back blow nozzle. The back blow nozzle is provided on the second direction side of the rotation plate. The back blow nozzle blows the object through the opening. The back blow nozzle blows a peripheral portion of the interior of the object. More preferably, the back blow nozzle is arranged so as to aim on the rotational trajectory of the blow target portion of the object. Here, the blowing target portion means a portion where the cleaning liquid is easily accumulated and it is desirable to blow the cleaning liquid. For example, the blowing target portion may be an internal thread, an oil hole, a pin hole, or a groove.

A method of using the above-mentioned dryer will be described. First, an object is mounted on a jig. Switch the direction changeover valve. A clamp fixes the object to the rotation plate. A drive motor rotates the rotation shaft. The cleaning liquid adhering to the surface of the object moves away from the object by centrifugal force. The blower ejects dry air. The dry air discharged by the blower is ejected from the inner fixed nozzle. The cleaning liquid adhering to the inner surface of the target is blown off by the dry air blown onto the object from the inner fixed nozzle. Blowing from the inner fixed nozzle promotes drying of the object. Dry air may also be ejected from the outer blow nozzle. The cleaning liquid adhering to the outer surface of the object is blown off by the air jetted from the outer blow nozzle. Blowing from the outer blow nozzle promotes drying of the object. The blower may supply dry air to the back blow nozzle. A compressed air source may be included. The compressed air source may supply compressed air to the back blow nozzle. The back blow nozzle blows dry air toward the interior surface of the object. The ejected dry air passes through the opening of the rotation plate to reach the target blowing portion of the object. The cleaning liquid adhering to the blowing target portion is blown off by the dry air ejected from the back blow nozzle. Blowing from the back blow nozzle promotes drying of the object. The inner fixed nozzle stops the injection. The outer blow nozzle stops the injection. The back blow nozzle jet stops the injection. The drive motor stops rotating. The drive motor can stop the rotation plate at a particular phase. The direction switching valve switches the flow path. The clamp releases the object.

Since the air ejected from the blow nozzle is supplied from the blower, the power consumption is low compared with the case where compressed air is used.

The back blow nozzle may be connected to a compressed air source. In this case, the back blow nozzle ejects compressed air.

The dryer of the present invention improves the degree of dryness when the bowl-shaped workpiece is installed with the inner side of the bowl facing the rotation plate.

DETAILED DESCRIPTION

Figure 1:
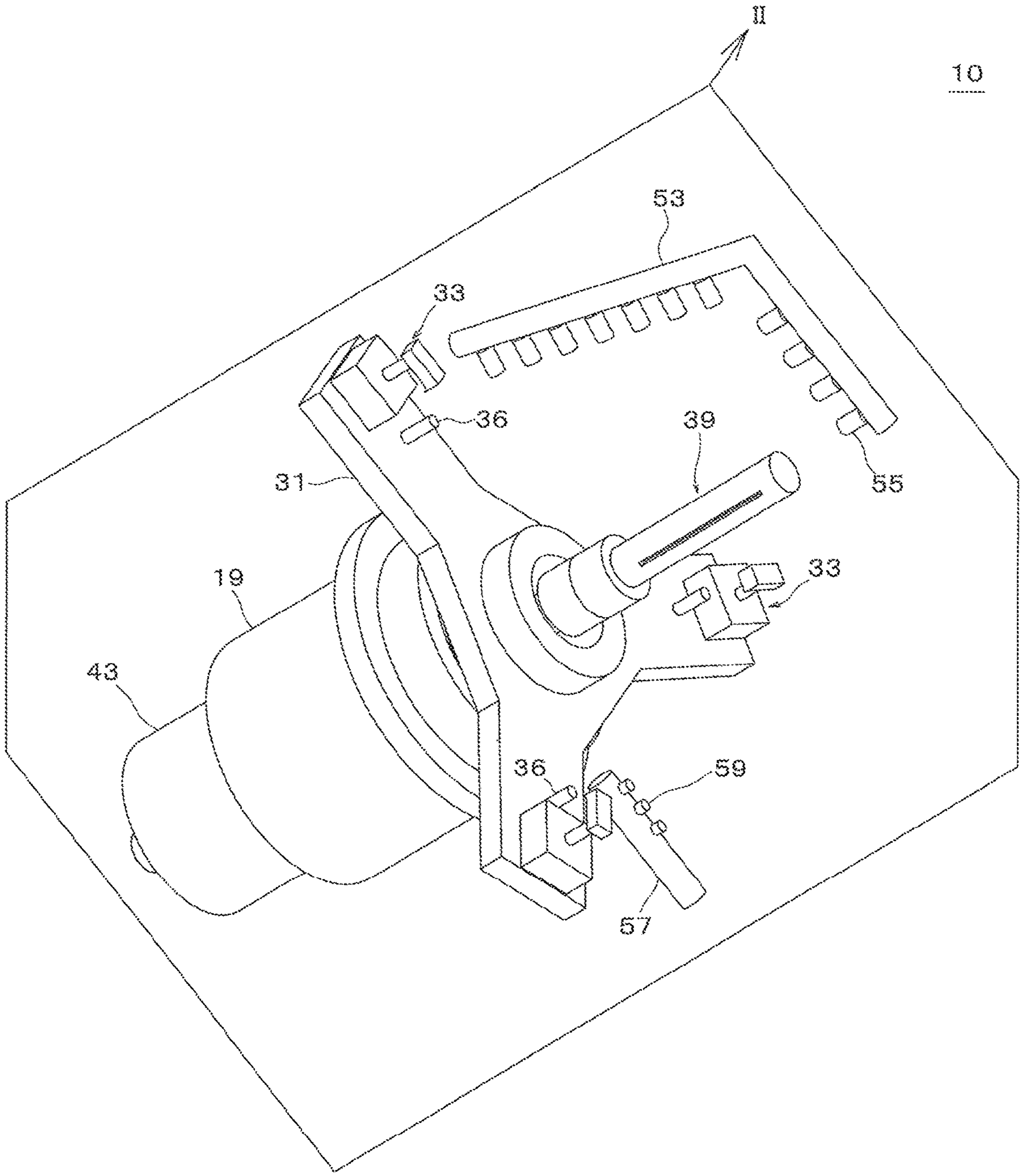
FIG. 1 is a perspective view of a dryer according to an embodiment.

Hereinafter, the dryer 10 of the embodiment will be described with reference to the drawings. The dryer 10 includes a rotation shaft 15, a center shaft 11, a rotation plate 31, an inner fixed nozzle (hereinafter referred to as "nozzle 39"), an inner blow passage (hereinafter referred to as "passage 12"), a jig 30, a drive motor (hereinafter referred to as "motor 29"), and a blower 32. Preferably, the dryer 10 has a blow pipe (hereinafter simply referred to as "pipe 53"), an outer blow nozzle (hereinafter simply referred to as "nozzle 55"), a back blow pipe (hereinafter simply referred to as "pipe 57"), a back blow nozzle (hereinafter simply referred to as "nozzle 59"), a housing 19, a base plate 21, a drive toothed pulley (hereinafter simply referred to as "pulley 25"), a driven toothed pulley (hereinafter simply referred to as "pulley 23"), an endless toothed belt (hereinafter simply referred to as "belt 27"), a compressed air source (hereinafter simply referred to as "air source 42"), a directional change valve (hereinafter simply referred to as "valve 49"), and a housing 43.

Figure 2:
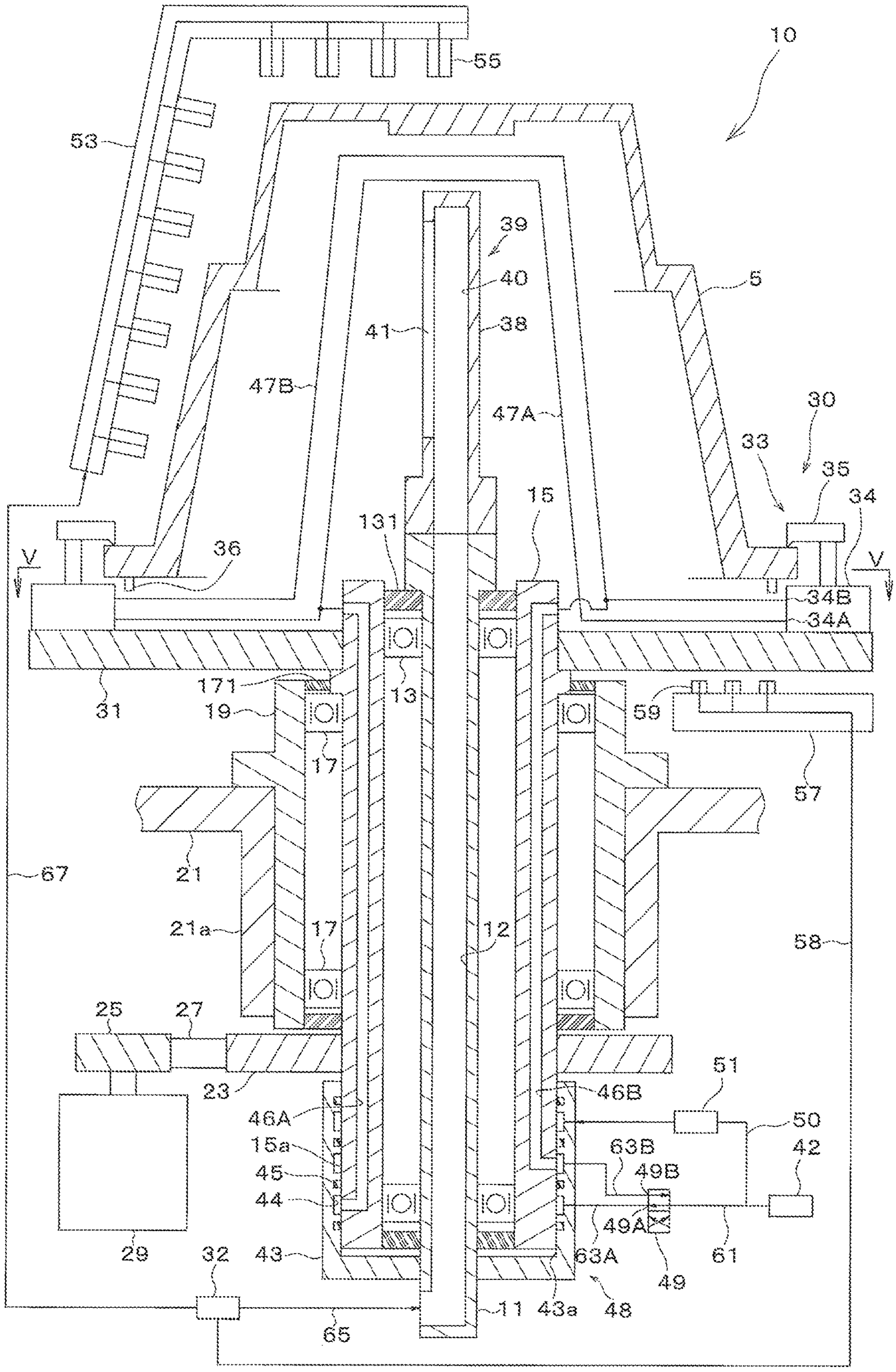
FIG. 2 is a cross-sectional view taken along plane II of FIG. 1.

In FIG. 2, the center shaft 11 extends in the vertical direction. In the following, an example in which the center shaft 11 extends in the vertical direction will be described in this embodiment, but the present invention is not limited to this, and the center shaft 11 may be arranged so as to extend in any direction. For example, the dryer 10 may be arranged laterally such that the center shaft 11 extends horizontally. Hereinafter, for convenience of description, the upper direction in FIG. 2 is referred to as a "first direction" and the lower direction in FIG. 2 is referred to as a "second direction".

The object 5 is fixed to a rotation plate 31. The rotation plate 31 rotates together with the object 5, and flushes the cleaning liquid or the like adhering to the object 5 by centrifugal force. The nozzle 39 blows dry air to the inside of the object 5. The nozzle 55 blows dry air to the outside of the object 5. In this way, the dryer 10 dries the object 5.

The base plate 21 is fixed to a frame (not shown) or the like. The base plate 21 has a cylindrical portion 21*a*. The housing 19 has a hollow cylindrical shape. The housing 19 is fitted to the cylindrical portion 21*a*. The housing 19 is fixed coaxially with the center shaft 11. Bearings 17 are inserted into both ends of the housing 19. The two bearings 17 are spaced apart. A seal 171 may be provided outside the bearing 17. The bearing 17 may be a sealed bearing. The rotation shaft 15 is supported by the bearing 17. The rotation shaft 15 passes through the housing 19. The rotation shaft 15 has a hollow cylindrical shape. The rotation shaft 15 is provided coaxially with the center shaft 11. The rotation plate 31 is fixed on one side of the rotation shaft 15 (upper part of FIG. 2). Bearings 13 are provided inside both ends of the rotation shaft 15. The two bearings 13 are spaced apart. A seal 131 may be provided outside the bearing 13. The bearing 13 may be a sealed bearing. The center shaft 11 is further provided inside the bearing 13. The center shaft 11 is fixed so as not to rotate. The center shaft 11 may be fixed to the base plate 21. The rotation shaft 15 is rotatably held between the center shaft 11 and the housing 19 via a bearing 17 and a bearing 13. The rotation plate 31 rotates integrally with the rotation shaft 15. The center shaft 11 has a passage 12 therein. The passage 12 extends along the center shaft of the center shaft H The passage 12 opens at both ends of the center shaft 11. The nozzle 39 is provided at the first end of the center shaft, above in FIG. 2. The other opening of the passage 12, below in FIG. 2, is connected to the blower 32 via a passage 65.

The bearings 13 and the bearings 17 are, for example, radial bearings. The bearings 13 and the bearings 17 may be thrust bearings.

The blower 32 blows off dry air. The dry air discharged by the blower 32 is ejected from the nozzles 39 and the nozzles 55 toward the object 5.

Preferably, the motor 29 is a synchronous motor, such as a servo motor, a permanent magnet synchronous motor, or the like.

The rotation shaft 15 is provided with a pulley 23. The pulley 23 is preferably provided on the lower side (second direction) of the housing 19. A pulley 25 is provided on the output shaft of the motor 29. A belt 27 is stretched between the pulley 23 and the pulley 25. The belt mechanism of the pulleys 23, 25 and the belt 27 reduces the rotational speed of the motor 29. The rotational speed of the rotation shaft 15 is desirably 200 to 500 rpm (including both ends). When the rotational speed becomes 200 rpm or more, the separation of the cleaning liquid adhering to the object 5 is promoted by the centrifugal force. On the other hand, a range of up to 500 rpm is easy to manufacture.

Instead of the pulley 23, the pulley 25, and the belt 27, a gear mechanism may be provided. The gear mechanism is, for example, a helical gear mechanism, a double helical gear mechanism, or a spur gear mechanism.

The jig 30 has a clamp 33. The jig 30 may include a seating pin 36 and a positioning pin, not shown. The jig 30 fixes the object 5 to the rotation plate 31. The seating pin 36 supports the object 5 at a position spaced apart from the rotation plate 31. The jig 30 has a plurality of seating pins 36. The clamp 33 has a cylinder 34 and a clamp arm 35. The arm 35 is opened and closed by the cylinder 34. In the figure, the arm 35 is provided directly on the piston rod of the cylinder 34, but a link may be provided between the cylinder 34 and the arm 35. The arm 35 presses the object 5 in the clamping position and releases the object 5 in the unclamped position. The cylinder 34 is, for example, a fluid cylinder such as an air cylinder.

Next, the passage of the compressed air to the cylinder 34 will be described. Here, description will be made on the assumption that the cylinder 34 is a double-acting cylinder.

The valve 49 is, for example, a four-port directional switching valve. The valve 49 is, for example, a solenoid valve. The air source 42 is, for example, a compressor or a supply port from the compressor. The air source 42 is connected to a supply port of a valve 49. The valve 49 supplies the supplied compressed air to one of the passage 63A and the passage 63B. The valve 49 opens the other of the passages 63A and 63B to the atmosphere.

A fluid rotary joint (hereinafter referred to simply as a "fluid joint 48") is provided at the second end (lower portion in FIG. 2) of the rotation shaft 15. The fluid joint 48 includes a housing 43, a rotation shaft 15, an annular passage 44, a seal 45, a first passage, and a second passage. The first and second passages are provided in the same number as the annular passages 44. The first passage (hereinafter simply referred to as "passage 63A" and "passage 63B") and the second passage (hereinafter referred to as "passage 46A" and "passage 46B") are connected to each other via an annular passage. Three annular passages 44 are shown in FIG. 2. For convenience of description, only two second passages 46A and 46B are shown in FIG. 2, but the third second passage is not shown.

The housing 43 is provided at the second end of the rotation shaft 15. The housing 43 has a hollow cylindrical shape. The housing 43 has an inner surface 43*a* which is a cylindrical surface. The inner surface 43*a* slides in the rotation direction with the outer surface 15*a* of the rotation shaft. The housing 43 is fixed to the center shaft 11 or the base plate 21. The housing 43 does not rotate. An annular passage 44 and a seal 45 are provided on the inner surface 43*a*. The annular passage 44 extends circumferentially all the way around. The inner surface 43*a* is provided with one or more annular passages 44, three annular passages shown in FIG. 2. The plurality of annular passages 44 are provided side by side in the axial direction. Each annular passage 44 is sealed by a seal 45. The annular passage 44 may be provided on the outer surface 15*a* together with the inner surface 43*a* or instead of the inner surface 43*a*.

The housing 43 is provided with passages 63A, 63B. Passages 63A and 63B connect to ports 49A and 49B of valve 49, respectively. The passages 63A and 63B are respectively connected to the annular passage 44.

The rotation shaft 15 has a passage 46A and a passage 46B inside. The passages 46A and 46B extend in the axial direction of the rotation shaft 15. The rotation shaft 15 has a plurality of passages 46A, 46B, and the like. At this time, the passages 46A, 46B, and the like are formed at different positions in the circumferential direction.

The ends of the passages 46A and 46B are connected to a third passage (hereinafter, simply referred to as "passage 47A" and "passage 47B"), The passages 47A and 47B connect with the ports 34A and 34B of the cylinder, respectively.

The cylinder 34 may be a single-acting cylinder. At this time, the rotation shaft 15 may not have the passage 46B. The upper sides of the passages 46A and 46B, i.e., the first direction side, respectively open to the outer surface of the rotation shaft 15.

The dryer 10 may include a seating sensor Si. In this case, the seating pin 36 has a seating nozzle (not shown) at a position in contact with the object 5. The seating sensor 51 is connected to the air source 42 via a passage 50. The seating sensor 51 is connected to the seating pin 36 via the fluid joint 48. The seating sensor 51 ejects compressed air from the seating pin 36. When the object 5 comes into close contact with the seating pin 36, the ejection of compressed air stops and the back pressure rises. The seating sensor 51 detects seating by increasing the back pressure.

The pipe 53 is arranged on the side of the object 5. The pipe 53 is arranged on an installation plane II, which is a plane containing the axis of rotation of the object 5. The pipe 53 is arranged outside the outer surface of the cross-section according to the installation plane II of the rotating object 5, the jig 30 and the rotation plate 31. The pipe 53 may be bent so as to extend to the end face side of the object 5. At this time, the pipe 53 extends in the radial direction from the center shaft 11. The pipe 53 extends to the vicinity of the axial center of the center shaft 11. The pipe 53 has a nozzle 55. Preferably, the pipe 53 has a plurality of nozzles 55 along the edge of the object 5. Preferably, the nozzle 55 blows the entire surface of the object 5. The nozzle 55 is, for example, a pipe-shaped nozzle. The nozzle 55 is arranged towards the outer surface of the object 5. The nozzle 55 is arranged outside the outer surface of the cross-section according to the installation plane II of the rotating object 5, the jig 30 and the rotation plate 31. The pipe 53 and the nozzle 55 are arranged outside the closed area occupied by the rotation plate 31, the jig 30 and the object 5 as they rotate. The pipe 53 is fixed to a base plate, a frame, or the like. The pipe 53 is connected to the blower 32. The nozzle 55 ejects the dry air discharged from the blower 32 toward the object 5.

When a part of the outer surface of the object 5 has a part where the cleaning liquid tends to remain, a blow nozzle may be separately provided toward the part where the cleaning liquid tends to remain. A blow nozzle provided separately may eject compressed air.

Figure 3:
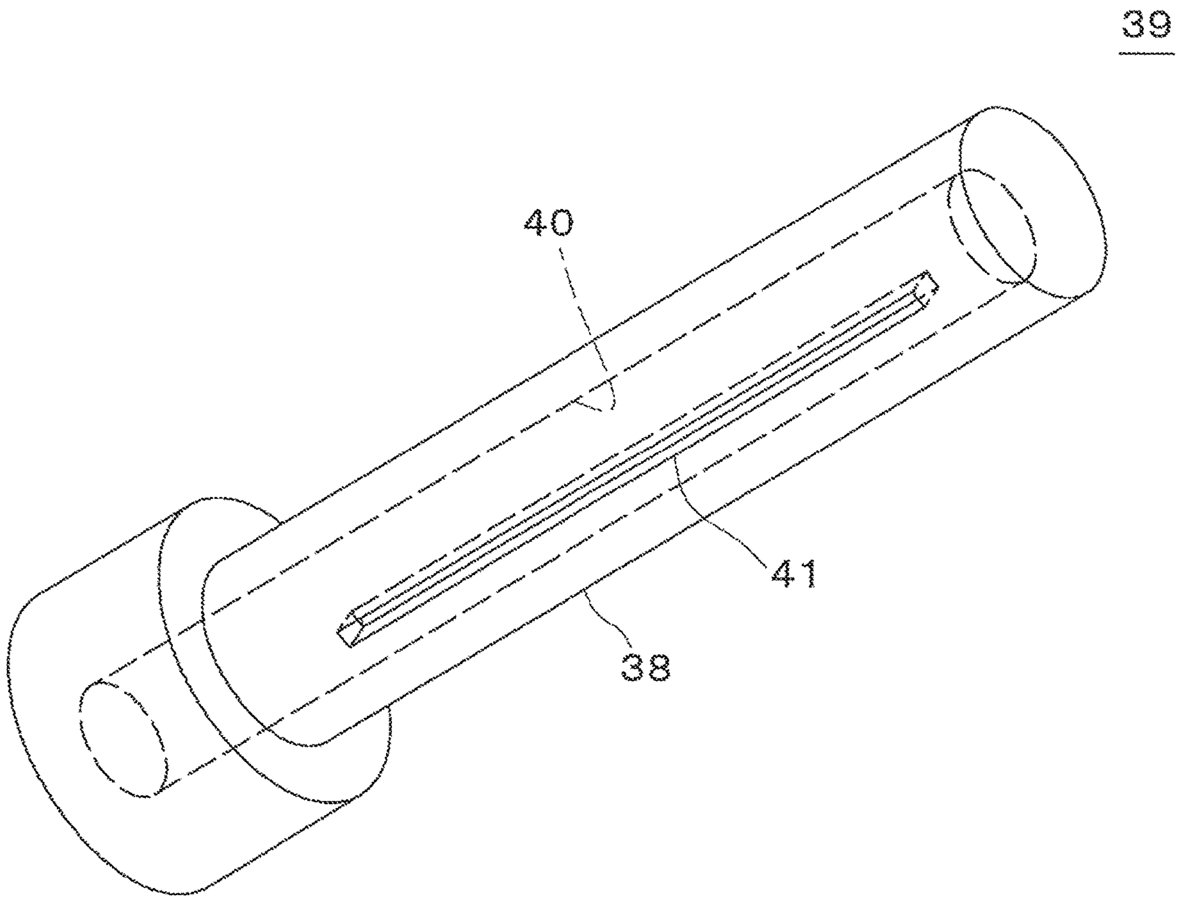
FIG. 3 shows a nozzle of the dryer of the embodiment.

As shown in FIG. 3, the nozzle 39 of the present embodiment has a body 38, a passage 40, and a slit 41. The body 38 is cylindrical. The passage 40 extends axially into the interior of the body 38. The passage 40 is open at one end and does not reach the tip at the other end. The slit 41 extends in the axial direction of the body 38 on a plane passing through the center shaft of the body 38. The slit 41 is provided at the center of the body 38. The length of the slit 41 is 60 to 90% of the length of the body 38. The slit 41 has a very narrow width. As shown in FIG. 2, the passage 40 connects with the passage 12. Preferably, passage 40 has the same inner diameter as passage 12.

Figure 4:
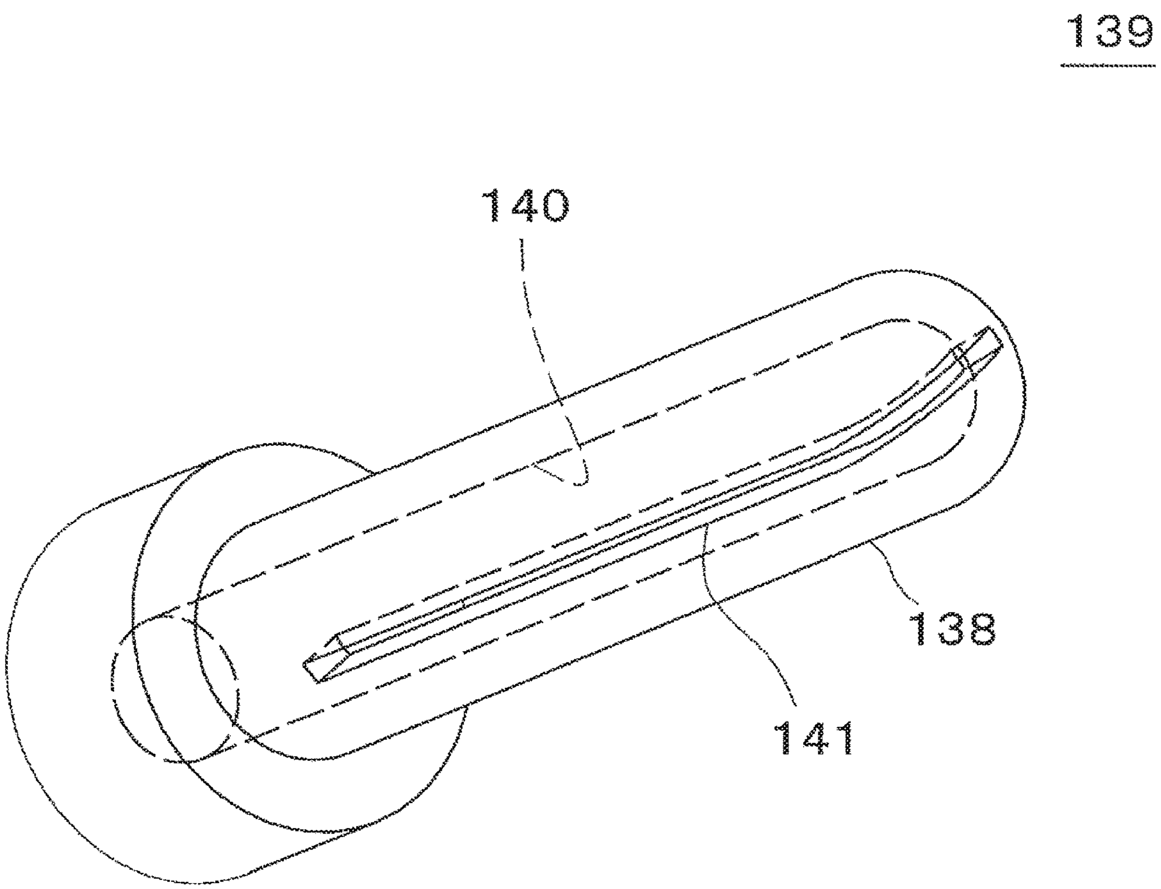
FIG. 4 shows a variation of a nozzle of the dryer.

FIG. 4 shows a nozzle 139 which is a variation of the nozzle 39. The distal end of the body 138 is hemispherical. The distal end of the passage 140 is also hemispherical in shape. The distal end portion of the slit 141 wraps around to the distal end portion of the body 138, and reaches the center shaft of the body 138. The slit 141 may extend beyond the center shaft of the body 138. The distal end of the body 138 in FIG. 3 may be flat.

As shown in FIG. 1 and FIG. 2, pipes 57 and nozzle 59 are located in the lower part (the second direction) of the rotation plate 31. The nozzle 59 is arranged opposite the object 5 with respect to the rotation plate 31. The nozzle 59 is arranged towards the object 5. The nozzle 59 ejects dry air toward the object 5. The pipe 57 and the blower 32 are connected by a passage 58. The passage 58 may connect the pipe 57 and the air source 42.

Figure 5:
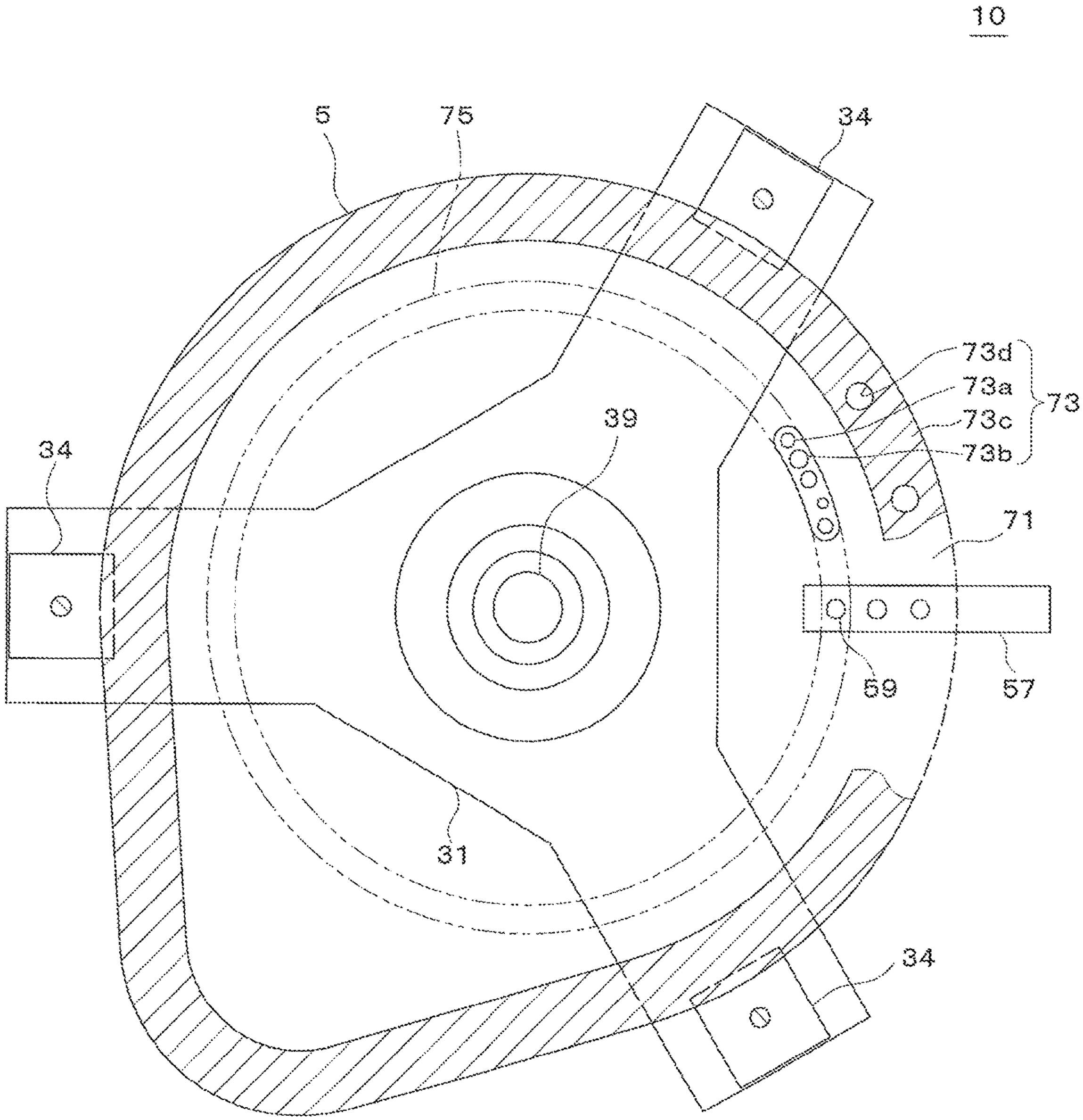
FIG. 5 is a cross-sectional view taken along line V-V of FIG. 2.

FIG. 5 is a cross-sectional view taken from above along line V-V of FIG. 2. As shown in FIG. 5, the rotation plate 31 has an opening 71 which exposes the object 5 from the bottom (the second direction) side. That is, when viewed from the surface of the rotation plate 31 opposite to the surface to which the object 5 is fixed, a part of the object 5 is exposed from the rotation plate 31. The portion of the object 5 exposed from the rotation plate 31 when viewed from below the rotation plate 31, i.e., from the second direction side, is defined as the opening 71. Typically, the rotation plate 31 has a star shape in which several thin rod-shaped flat plates radiate from the rotation shaft 15. In the figure, the rotation plate 31 has a Y shape in which the plate extends in a rod shape from each apex of the triangular plate. The center of the center triangle is bored out in a circle. The rotation shaft 15 is fixed to the central hollow portion. A clamp 33, a seating pin 36, and/or a positioning pin (not shown) are provided at a distal end portion of the flat plate extending from the rotation shaft 15.

The jig 30 of the present embodiment has three cylinders 34 and seating pins 36 on the outer circumference. Therefore, the rotation plate 31 is Y-shaped. When the bowl-shaped object 5 is fixed to the rotation plate 31 and viewed from below (second direction side), a part of the inner surface of the object 5 is exposed from the rotation plate 31.

Object 5 has a blow object portion inside (hereinafter, it is simply called 'portion 73'). The portion 73 is a portion where the washing liquid or the like tends to remain. The portion 73 is, for example, a female screw 73*a*, an oil hole 73*b*, a mating surface 73*c*, a through hole 73*d*, a pin hole 73*e* (not shown), or the like. When the object 5 is fixed to the rotation plate 31, the opening 71 exposes a portion 73 when viewed from the second direction side.

When the object 5 fixed to the rotation plate 31 rotates, a closed region through which the portion 73 passes is defined as a trajectory 75. The nozzle 59 is disposed so as to face the trajectory 75. The nozzle 59 is positioned so as to aim at the portion 73 of the rotating object 5.

REFERENCE SIGNS LIST

5 Objects (dry objects)
10 Dryer
11 Center shaft
15 Rotation axis
29 Motor
31 Rotation plate
32 Blower
33 Clamp
39 Nozzle (inner fixed nozzle)
55 Nozzle (outer blow nozzle)

What is claimed is:

1. A dryer for drying an object, comprising:
a hollow cylindrical rotation shaft configured to rotate;
a center shaft supported inside of the rotation shaft via a bearing, the center shaft configured not to rotate, the center shaft having an inner blow passage therein extending along the center shaft;
a rotation plate fixed to a first end of the rotation shaft;
an inner fixed nozzle extending along the first end side of the rotation shaft from the center shaft;
a jig disposed on the rotation plate for fixing the object;
a drive motor configured to rotate the rotation shaft;
a blower connected to the inner blow passage;
a housing slidably fixed to an outer surface of the rotation shaft at a second end that is different from the first end;
a compressed air source;
an annular passage extending circumferentially between the housing and the rotation shaft;
a first passage connecting the annular passage and the compressed air source; and
a second passage extending inside the rotation shaft in a shaft direction, the second passage connecting to the annular passage, the second passage having an opening at the first end of the rotation shaft,
wherein the jig includes
a clamp having an air cylinder, and
a third passage connecting the second passage and the air cylinder.

2. The dryer according to claim 1, wherein
the inner fixed nozzle includes a cylindrical pipe-shaped body extending along the rotation shaft and having a closed end at one end, the inner fixed nozzle having a slit extending along the rotation shaft.

3. The dryer according to claim 2, wherein
the slit extends from a basal end fixed to the center shaft to around a distal surface of the body.

4. The dryer according to claim 1, wherein
the rotation shaft rotates at a rotational speed of 200 to 500 rpm.

5. The dryer according to claim 1, further comprising:
an outer blow nozzle arranged outside a closed area occupied by rotating the rotation plate, the object and the jig, the outer blow nozzle facing the object.

6. The dryer according to claim 1, wherein
the rotation plate has an opening exposing a blow object portion of the object from the rotation plate when the object is mounted on the rotation plate.

7. The dryer according to claim 1, further comprising:

a drive toothed pulley;

a driven toothed pulley; and an endless toothed belt stretched between the drive toothed pulley and the driven toothed pulley, wherein the drive motor is a servo motor.

8. The dryer according to claim 2, wherein the rotation shaft rotates at a rotational speed of 200 to 500 rpm.

9. The dryer according to claim 3, wherein the rotation shaft rotates at a rotational speed of 200 to 500 rpm.

10. The dryer according to claim 2, further comprising:

an outer blow nozzle arranged outside a closed area occupied by rotating the rotation plate, the object and the jig, the outer blow nozzle facing the object.

11. The dryer according to claim 3, further comprising:

an outer blow nozzle arranged outside a closed area occupied by rotating the rotation plate, the object and the jig, the outer blow nozzle facing the object.

12. The dryer according to claim 4, further comprising:

an outer blow nozzle arranged outside a closed area occupied by rotating the rotation plate, the object and the jig, the outer blow nozzle facing the object.

13. The dryer according to claim 2, wherein the rotation plate has an opening exposing a blow object portion of the object from the rotation plate when the object is mounted on the rotation plate.

14. The dryer according to claim 3, wherein the rotation plate has an opening exposing a blow object portion of the object from the rotation plate when the object is mounted on the rotation plate.

15. The dryer according to claim 4, wherein the rotation plate has an opening exposing a blow object portion of the object from the rotation plate when the object is mounted on the rotation plate.

16. The dryer according to claim 5, wherein the rotation plate has an opening exposing a blow object portion of the object from the rotation plate when the object is mounted on the rotation plate.

17. The dryer according to claim 2, further comprising:

a drive toothed pulley;

a driven toothed pulley; and an endless toothed belt stretched between the drive toothed pulley and the driven toothed pulley, wherein the drive motor is a servo motor.

18. The dryer according to claim 3, further comprising:

a drive toothed pulley;

a driven toothed pulley; and an endless toothed belt stretched between the drive toothed pulley and the driven toothed pulley, wherein the drive motor is a servo motor.

19. The dryer according to claim 4, further comprising:

a drive toothed pulley;

a driven toothed pulley; and an endless toothed belt stretched between the drive toothed pulley and the driven toothed pulley, wherein the drive motor is a servo motor.

* * * * *